(12) United States Patent
Hirayanagi

(10) Patent No.: US 7,862,961 B2
(45) Date of Patent: Jan. 4, 2011

(54) MASK AND EXPOSURE APPARATUS

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 383 days.

(21) Appl. No.: 11/707,003

(22) Filed: Feb. 16, 2007

(65) Prior Publication Data

US 2007/0190433 A1 Aug. 16, 2007

Related U.S. Application Data

(60) Provisional application No. 60/873,978, filed on Dec. 11, 2006.

(30) Foreign Application Priority Data

Feb. 16, 2006 (JP) ............................. 2006-039447

(51) Int. Cl.
*G03F 1/14* (2006.01)
*G03B 27/62* (2006.01)

(52) U.S. Cl. ............................................ 430/5; 355/75
(58) Field of Classification Search ..................... 430/5; 355/75
See application file for complete search history.

(56) References Cited

U.S. PATENT DOCUMENTS 6,825,481 B2 11/2004 Miyake (Continued)

FOREIGN PATENT DOCUMENTS

JP 05-150445 6/1993

(Continued)

OTHER PUBLICATIONS

Werner A. Goedel, "From Monolayers of a Tethered Polymer Melt to Freely Suspended Elastic Membranes", 1998 American Chemical Society, Chapter 2, pp. 10-30.*

(Continued)

*Primary Examiner*—Mark F Huff
*Assistant Examiner*—Jonathan Jelsma
(74) *Attorney, Agent, or Firm*—Finnegan, Henderson, Farabow, Garrett & Dunner, L.L.P.

(57) ABSTRACT

An exposure apparatus transfers a pattern from a mask onto a sensitive substrate. A film protects the mask, and a film frame, between the mask and the film, holds the film spaced away from a surface of the mask. The film has a first transmittance for radiation of a necessary wavelength and has a second transmittance for radiation of an unnecessary wavelength; the first transmittance is higher than the second transmittance. The film might reflect or absorb the unnecessary wavelength. The necessary wavelength may be an exposure wavelength and may also be in the range of extreme ultra violet radiation. An atmosphere around the mask transitions from an air atmosphere to a reduced-pressure atmosphere, or from a reduced-pressure atmosphere to an air atmosphere, at a speed that allows a difference between a pressure applied to one surface of the film and a pressure applied to the other surface of the film to be held at a predetermined value or smaller.

18 Claims, 7 Drawing Sheets

U.S. PATENT DOCUMENTS

| | | |
|---|---|---|
| 7,094,505 B2 | 8/2006 | Zhang et al. |
| 2004/0137339 A1 | 7/2004 | Zhang et al. |
| 2005/0040345 A1 | 2/2005 | Bakker et al. |
| 2005/0042153 A1* | 2/2005 | Bristol et al. ............ 422/186.3 |
| 2006/0263703 A1 | 11/2006 | Zhang et al. |

FOREIGN PATENT DOCUMENTS

| | | |
|---|---|---|
| JP | 2005-043895 | 2/2005 |
| JP | 2006-504996 | 2/2006 |

OTHER PUBLICATIONS

Shroff et al., "EUV Pellicle Development for Mask Defect Control", SPIE, vol. 6151 615104-1, Mar. 22, 2006.

Shroff, Yashesh et al., EUV Pellicle Development for Mask Defect Control, Proc. of SPIE vol. 6151, 615104-1, (Mar. 22, 2006).

\* cited by examiner

MASK AND EXPOSURE APPARATUS

This patent application claims priority to provisional application No. 60/873,978 filed on Dec. 11, 2006, the contents of which are incorporated herein by reference. This patent application also claims priority to Japanese Patent Application No. 2006-039447, filed on Feb. 16, 2006, the contents of which are incorporated herein by reference.

BACKGROUND OF THE INVENTION

A. Field of the Invention

The present invention relates to an apparatus for protecting a lithography mask having a pattern for manufacturing a micro-device, such as a semiconductor device or a liquid crystal display device. Also, the present invention relates to an exposure apparatus that transfers the pattern through exposure.

B. Description of the Related Art

Projection lithography technology may use Extreme Ultraviolet (EUV) light or radiation having a short wavelength (5 to 50 nm) to enhance the resolving power for micro-fabrication of semiconductor device circuits. Because an optical element of transmission-refraction type, such as a conventional lens, may not be used in such a wavelength range, an optical element of reflection type, such as a mirror, and a mask of reflection type may be used. See U.S. Pat. No. 6,825,481.

In an exposure apparatus for fabricating semiconductor device circuits, a pattern surface of a mask is protected with a pellicle or the like made from a thin film, so as to prevent a foreign substance from adhering to the pattern provided on the mask. In an exposure apparatus using EUV, however, an amount of EUV light as exposure light is significantly decreased when passing through a foreign-substance protection film such as a pellicle, resulting in decrease in throughput.

SUMMARY OF THE INVENTION

An object of the present invention is to provide an apparatus for protecting a mask capable of avoiding decrease in amount of light irradiating a pattern surface, and also to provide an exposure apparatus for transferring the pattern provided on the mask through exposure.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, an apparatus protects a projection lithography mask, the mask having a pattern for transfer to a substrate. The apparatus includes a film having a first transmittance for radiation of a necessary wavelength and having a second transmittance for radiation of an unnecessary wavelength, the first transmittance being higher than the second transmittance; and a film frame between the mask and the film, the film frame holding the film at a position spaced away from a surface of the mask.

According to another embodiment, an apparatus protects a projection lithography mask, the mask having a pattern for transfer to a substrate. The apparatus includes a film frame including a standing portion on a surface of the mask and a supporting portion protruding from the standing portion along the surface of the mask; and a film supported by the film frame at a position spaced away from the surface of the mask, wherein the standing portion and the supporting portion each have a filter.

According to another embodiment, an exposure apparatus transfers a pattern from a mask onto a sensitive substrate. A film transmitting light having a necessary wavelength and not transmitting light having an unnecessary wavelength protects the mask, and a film frame, between the mask and the film, holds the film at a position spaced away from a surface of the mask.

According to another embodiment, an atmosphere around the mask transitions from an air atmosphere to a reduced-pressure atmosphere, or from a reduced-pressure atmosphere to an air atmosphere, at a speed that allows a difference between a pressure applied to one surface of the film and a pressure applied to the other surface of the film to be held at a predetermined value or smaller.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
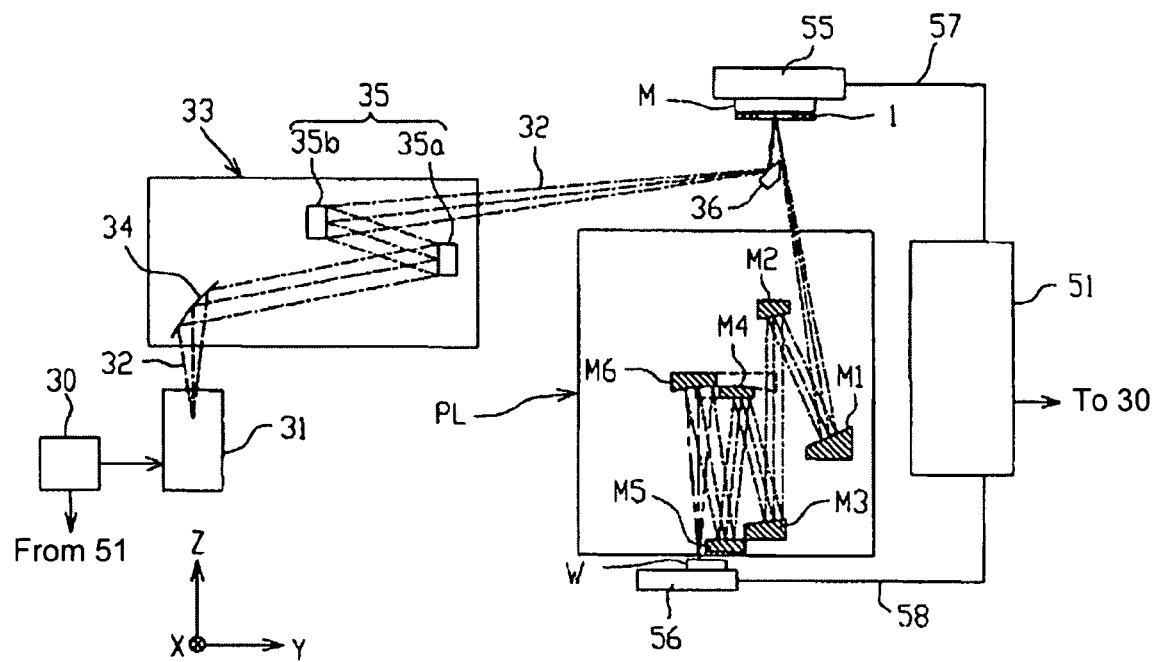
FIG. 1 is an illustration showing a configuration of an exposure apparatus according to a first embodiment.

An exposure apparatus and a mask according to a first embodiment will be described below with reference to the drawings. FIG. 1 is an illustration showing a general configuration of an exposure apparatus according to the first embodiment. In the following description, XYZ orthogonal coordinate system is determined as shown in FIG. 1, and the positional relationship of components are described with reference to the XYZ orthogonal coordinate system. The XYZ orthogonal coordinate system is determined such that the X-axis and the Y-axis are parallel to a wafer W as a sensitive substrate, and the Z-axis is orthogonal to the wafer W. In practice, the XYZ orthogonal coordinate system in the drawing is determined such that the X-Y plane is parallel to a horizontal plane, and Z-axis is along a vertical direction. In this embodiment, the wafer W is moved (scanning direction) in the X direction.

The exposure apparatus includes an EUV light source 31 that emits EUV light 32. A power source 30 is connected to the EUV light source 31. Operating the power source 30 causes the EUV light source 31 to emit the EUV light 32. A control device 51 controls the operation of the power source 30. By controlling the operation of the power source 30, the light intensity of the EUV light 32 emitted from the EUV light source 31 may be varied, and consequently, an amount of exposure light may be varied.

The EUV light 32 emitted from the EUV light source 31 becomes parallel light beams through a concave reflection mirror 34, which is provided in an illumination optical system 33 and serves as a collimator mirror, and the light beams enter an optical integrator 35. The optical integrator 35 includes an entrance fly-eye mirror 35a and an exit fly-eye mirror 35b. The entrance fly-eye mirror 35a has a plurality of arcuate elemental mirrors aligned in parallel. The incident surface of the entrance fly-eye mirror 35a is located at a position optically conjugated with respect to surfaces of a mask M and the wafer W (described later), or it is located in the vicinity of that position. The EUV light incident on the entrance fly-eye mirror 35a is wave front-divided by each of the elemental mirrors of the entrance fly-eye mirror 35a.

The EUV light incident on the entrance fly-eye mirror 35a is reflected by the entrance fly-eye mirror 35a and enters the exit fly-eye mirror 35b. The exit fly-eye mirror 35b has a plurality of rectangular elemental mirrors aligned in parallel. The irradiation surface of the exit fly-eye mirror 35b is located at a position optically conjugated with respect to a pupil position of a projection optical system PL (described later), or it is located in the vicinity of that position. The EUV light reflected by each of the elemental mirrors of the entrance fly-eye mirror 35a enters each of the elemental mirrors of the exit fly-eye mirror 35b. Accordingly, a plurality of light-condensing points are produced at the irradiation side of the exit fly-eye mirror 35b or at the vicinity thereof in accordance with the number of the elemental mirrors of the exit fly-eye mirror 35b. The light-condensing points serve as a secondary light source.

The EUV light reflected by the exit fly-eye mirror 35b is deflected by a flat reflection mirror 36, passes through a long, arcuate field stop slit S of an exposure area defining member defining member 1, and forms an arcuate illumination area on the mask M (reflection-type mask).

Figure 2:
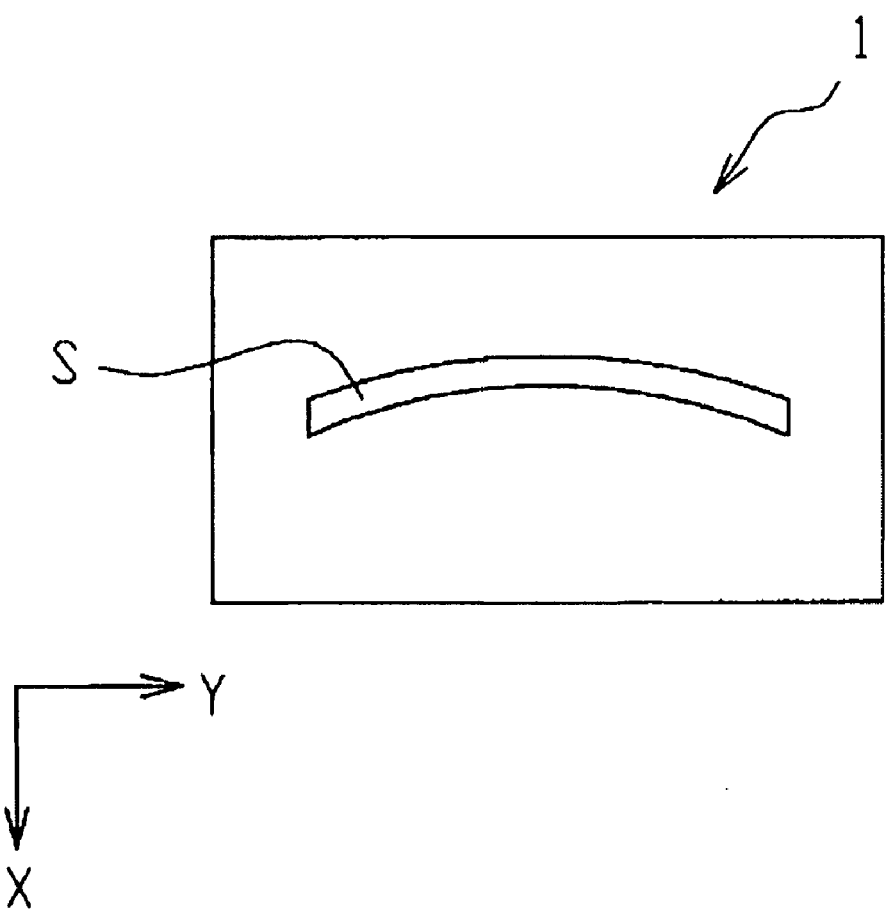
FIG. 2 is an illustration showing a configuration of an exposure area defining member according to the first embodiment.

FIG. 2 is an illustration showing a configuration of the exposure area defining member 1. The exposure area defining member 1 is disposed between the mask M and the projection optical system PL, and has the arcuate field stop slit S for defining the exposure area of the wafer W. Because the EUV light passes through the arcuate field stop slit S, the illumination area on the mask M becomes arcuate. It is important that the exposure area of the EUV light led onto the wafer W has a predetermined shape. Thus, the EUV light may be blocked by the field stop slit S before the EUV light is reflected by the mask M. Alternatively, the EUV light may be blocked by the field stop slit S after the EUV light is reflected by the mask M. While the exposure area in this embodiment is determined to be arcuate, the exposure area may be some other shape.

The mask M includes a pattern and is mounted on a mask stage 55. The mask stage 55 may be moved in the X, Y, and Z-axis directions, and in rotation directions about the X, Y, and Z-axes.

Figure 3:
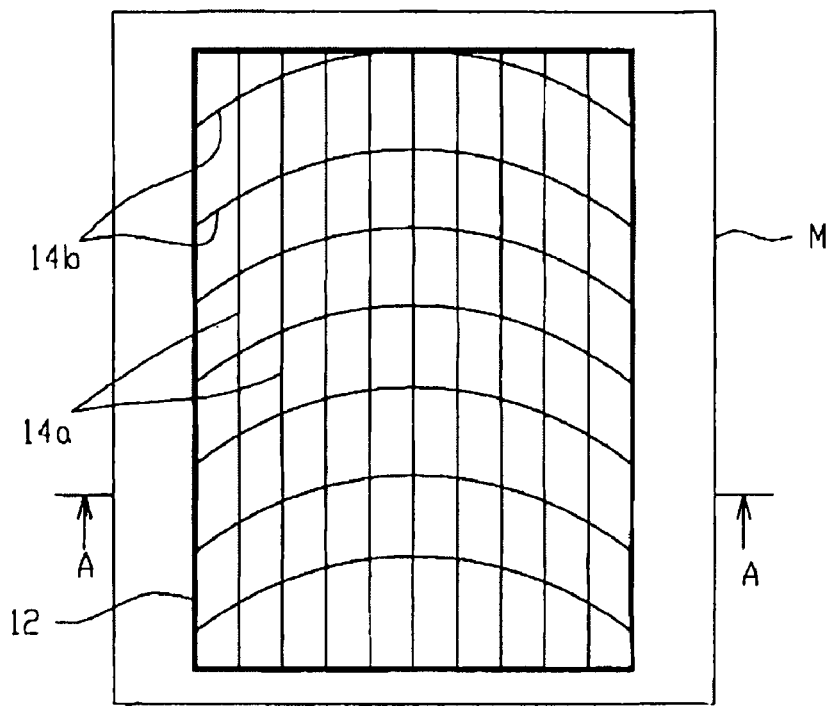
FIG. 3 is a plan view showing a configuration of a mask according to the first embodiment.
Figure 4:
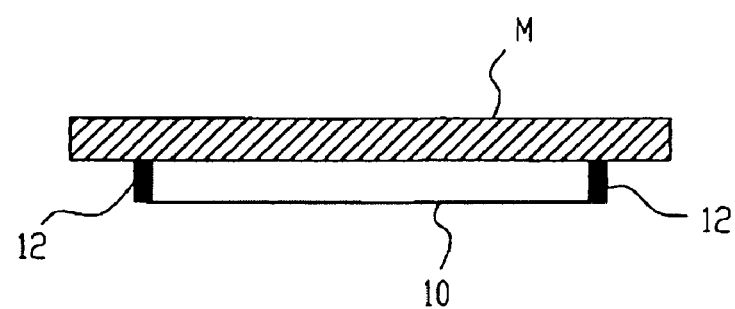
FIG. 4 is a cross-sectional view showing the configuration of the mask according to the first embodiment.

FIG. 3 is a plan view showing a configuration of the mask M according to the first embodiment. FIG. 4 is a cross-sectional view showing the configuration of the mask M taken along line A-A in FIG. 3.

As shown in FIGS. 3 and 4, the mask M includes a protection apparatus, such as a protection film 10. The foreign-substance protection film 10 may be separated from the surface of the mask M by a predetermined distance, such as for example, 10 mm. For example, the position may be determined such that the distance is in a range of from 1 to 50 mm (preferably, a range of from 6 to 20 mm). If the distance between the mask M and the foreign-substance protection film 10 is too small, any foreign substance adhered onto the foreign-substance protection film 10 and the shape of the structure such as supports 14a and 14b (described later) might be undesirably transferred to the wafer W. If the distance between the mask M and the foreign-substance protection film 10 is too large, the foreign-substance protection film 10 might mechanically interfere with other structure (e.g., the exposure area defining member 1) disposed in the immediate vicinity of the mask M. The foreign-substance protection film 10 thus prevents a foreign substance from adhering onto the surface of the mask M.

The foreign-substance protection film 10 preferably transmits light in a wavelength range necessary for exposure, for example, light with a wavelength of 13.5 nm, from among the EUV light 32. In addition, the foreign-substance protection film 10 preferably absorbs light in a wavelength range unnecessary for exposure. For example, the protection film 10 may include a zirconium thin film. The thin film may be a single layer film, but may also be a multilayer film. While the foreign-substance protection film 10 preferably absorbs light in the unnecessary wavelength range in this embodiment, the light in the unnecessary wavelength range may be reflected. If a multilayer film is employed, only the unnecessary light may be reflected.

A zirconium film with a 1500 Å mesh, available from Luxel Corporation, is a further, more specific example of a foreign-substance protection film 10. This film typically has about a 70% transmittance of 13.5 nm wavelength radiation and about a 10% transmittance of 200 nm wavelength radiation. The zirconium film thus transmits radiation having a necessary wavelength and does not transmit radiation having an unnecessary wavelength.

According to an exemplary multilayer film, a first film, such as silicon, that may be relatively easily prepared as a self-supported film is selected. A single film or a multilayer film that decreases the unnecessary light is then formed on the upper or lower side of the first film. For example, a silicon film of 200 nm in thickness may be prepared, and then a zirconium film of 100 nm in thickness may be formed thereon.

The selected thickness of the foreign-substance protection film 10 preferably minimizes attenuation of the exposure light, while still allowing the foreign-substance protection film 10 to be self-supported. The appropriate thickness of the foreign-substance protection film 10 may be determined case by case according to the material and area of the protection film 10, and the presence of other structure, such as a support. For example, the thickness of the foreign-substance protection film 10 may be in a range of from 50 to 1000 nm. In a case where the light with the unnecessary wavelength is not actively eliminated, the protection film may use other material such as silicon, a silicon compound, carbon, diamond, or polyimide. The foreign-substance protection film 10 may also serve as a wavelength selective filter. Therefore, the illumination optical system 33 does not need to have a separate wavelength selective filter, and the amount of exposure light in the whole system may be improved.

In addition, the foreign-substance protection film 10 is supported by a foreign-substance protection film frame 12, and the entire surface of the foreign-substance protection film 10 is supported by the supports 14a and 14b. By the provision of the supports 14a and 14b, the foreign-substance protection film 10 is hardly broken, and it is likely to be self-supported. Accordingly, the foreign-substance protection film 10 may be thinner, and the attenuation of the light with the exposure wavelength may be reduced. The supports 14a may comprise an extra-fine line member, such as a wire. The supports 14a may extend straight along the same direction that the mask M and the wafer W are scanned in the X direction (scanning direction). The supports 14b may comprise an extra-fine line member, such as a wire. The supports 14b may extend to follow the profile of a fixed exposure area, the fixed exposure being formed on the wafer W. The fixed exposure area preferably extends in the Y direction (the direction orthogonal to the scanning direction) as shown in FIG. 4, i.e., a profile along the Y direction of the field stop slit S, or a profile approximate to that profile.

The EUV light reflected by the mask M forms an image of a pattern of the mask M on the wafer W through the projection optical system PL including a plurality of reflection mirrors (for instance, six reflection mirrors M1 to M6 are shown in FIG. 1). A wafer stage 56 holds the wafer W. The wafer stage 56 preferably moves in the X, Y, and Z-axis directions and preferably rotates about the X, Y, and Z-axes.

Interferometers measure the positions of the mask stage 55 and wafer stage 56. The interferometers output the measurement results to the control device 51. The control device 51 outputs driving signals 57 and 58 to the mask stage 55 and the wafer stage 56. Actuators, such as linear motors or air actuators, move the mask stage 55 and the wafer stage 56, based on the driving signals 57 and 58 output from the control device 51.

Figure 5:
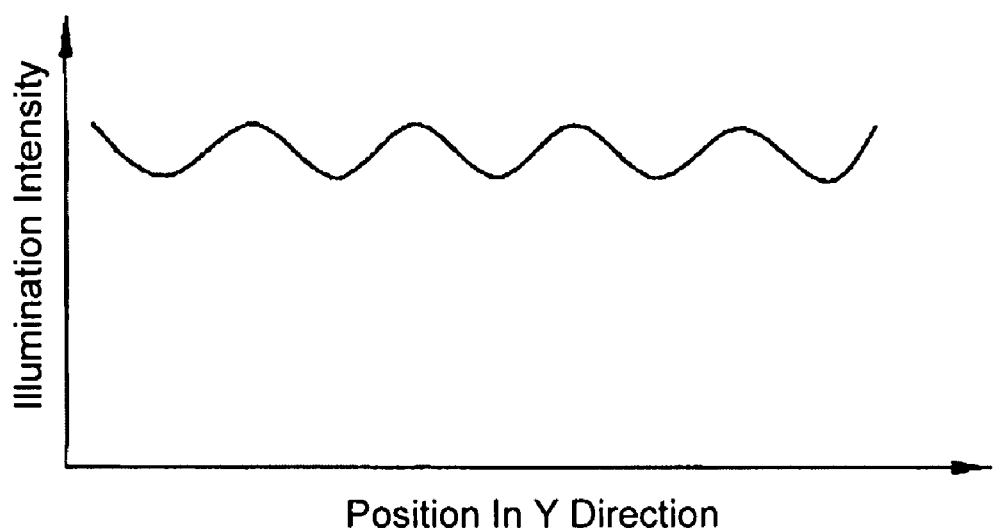
FIG. 5 is a graph showing distribution of illumination intensity in the Y direction.
Figure 6:
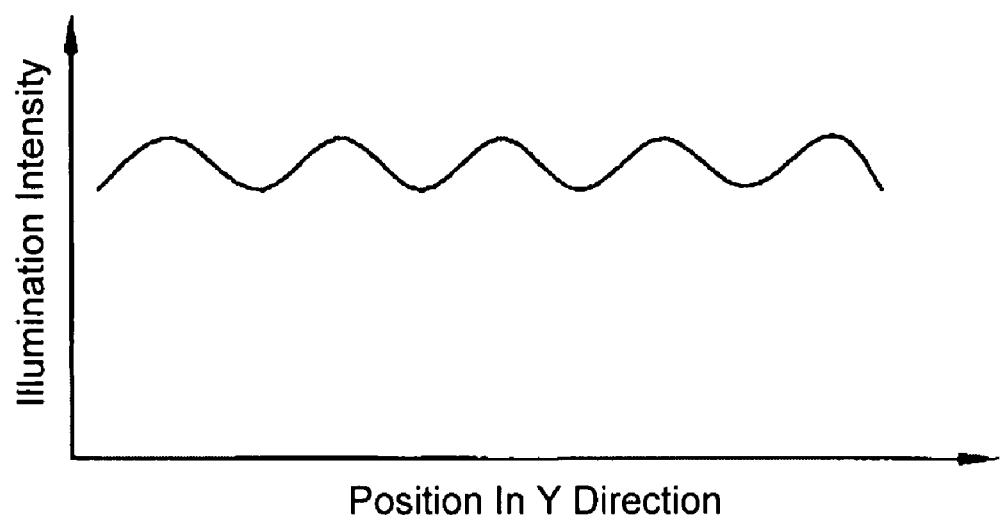
FIG. 6 is a graph showing distribution of illumination intensity for correcting the distribution of illumination intensity in the Y direction.
Figure 7:
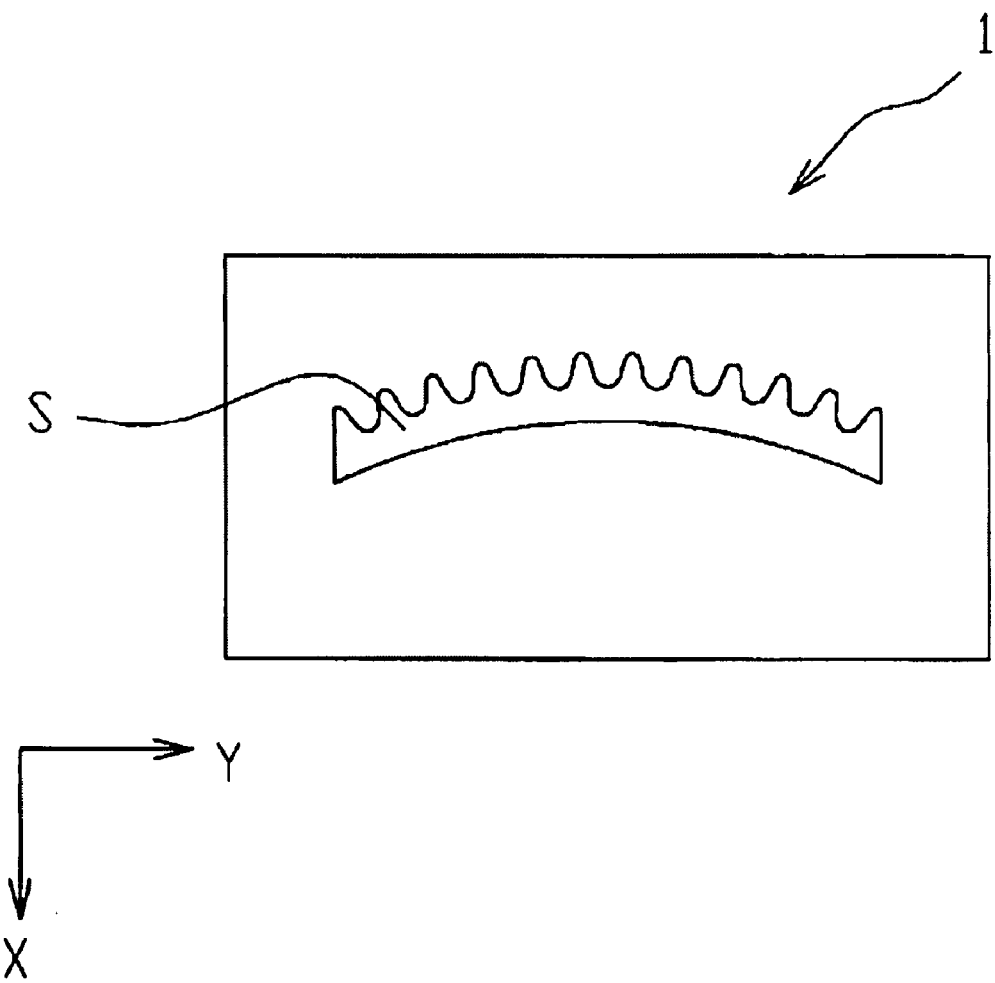
FIG. 7 is an illustration showing another configuration of an exposure area defining member according to the first embodiment.

In this embodiment, the supports 14a and 14b may correct illumination unevenness (unevenness of light intensity) generated in the exposure area. Because the supports 14a are formed straight along the scanning direction, the illumination intensity is varied one-dimensionally by the supports 14a, for instance, as shown in the graph of FIG. 5, thereby generating illumination unevenness. If the illumination unevenness becomes a bottleneck in an exposure procedure, correction is necessary so that illumination uniformity meets the specifications. For example, distribution of illumination intensity (distribution of exposure light) as shown in the graph of FIG. 6, i.e., distribution of illumination intensity inverse to that shown in FIG. 5, is applied, and accordingly, the illumination unevenness (distribution of exposure light) due to the supports 14a can be corrected. In particular, the profile of the field stop slit S employs the profile shown in FIG. 7, in order to apply the illumination intensity as shown in the graph of FIG. 6. While the profile of the field stop slit S has the wave form only at the upper portion shown in FIG. 7, the lower portion or both the upper and lower portions may be varied in profile. Alternatively, a light-shielding member may be disposed at the aperture of the field stop slit S for the above-mentioned correction.

Because the supports 14b are formed along the Y direction, the supports 14b may cause an error in the amount of exposure light while scanning and exposing. In such a case, by controlling the scanning speeds of the mask stage 55 and wafer stage 56, the amount of exposure light may be controlled to correct the error of the amount of exposure light caused by the supports 14b. In particular, at the scanning over the supports 14b, the scanning speeds of the mask stage 55 and wafer stage 56 are reduced, and the amount of exposure light is increased, thereby correcting the decrease in the amount of exposure light caused by the supports 14b. While scanning over an area not occupied by the supports 14b, the scanning speeds of the mask stage 55 and wafer stage 56 are increased, and the amount of exposure light is decreased, thereby correcting the decrease in the amount of exposure light caused by the supports 14b.

Alternatively, by controlling the light intensity of the EUV light 32 emitted from the EUV light source 31, using the power source 30, the amount of exposure light may be controlled to correct the error of the amount of exposure light caused by the supports 14b. In such a case, while scanning over the supports 14b, the light intensity of the EUV light 32 emitted from the EUV light source 31 is increased, and accordingly, the amount of exposure light is increased, thereby correcting the decrease in the amount of exposure light due to the supports 14b. While scanning over an area not occupied by the supports 14b, the light intensity of the EUV light 32 emitted from the EUV light source 31 is decreased, and the amount of exposure light is decreased, thereby correcting the decrease in the amount of exposure light due to the supports 14b. Still alternatively, a light-decreasing filter may be disposed in the middle of the optical path, or gas may be applied thereto, for controlling the exposure amount. Still alternatively, the thickness of the foreign-substance protection film 10 at the area not occupied by the supports 14b may be relatively increased, so that an amount of light is decreased at the area not occupied by the supports 14b, by the same amount as that reduced at an area occupied by the supports 14b.

The mask according to the first embodiment includes the foreign-substance protection film 10 that prevents a foreign substance from adhering onto the pattern surface. The foreign-substance protection film 10 may also serve as a wavelength selective filter that transmits the light in the wavelength range necessary for the exposure and absorbs the light with the unnecessary wavelength. Therefore, even if a wavelength selective filter is not additionally provided, a pattern can be illuminated with the light in the wavelength range necessary for exposure. A decrease in the amount of exposure light due to the additional foreign-substance protection film may also be prevented. In addition, because the supports 14a and 14b for supporting the foreign-substance protection film 10 are provided, the thickness of the foreign-substance protection film 10 may be decreased, thereby preventing the decrease in amount of exposure light.

With the exposure apparatus according to the first embodiment, the illumination unevenness due to the supports 14a and 14b may be corrected appropriately, thereby providing effective exposure.

Figure 8:
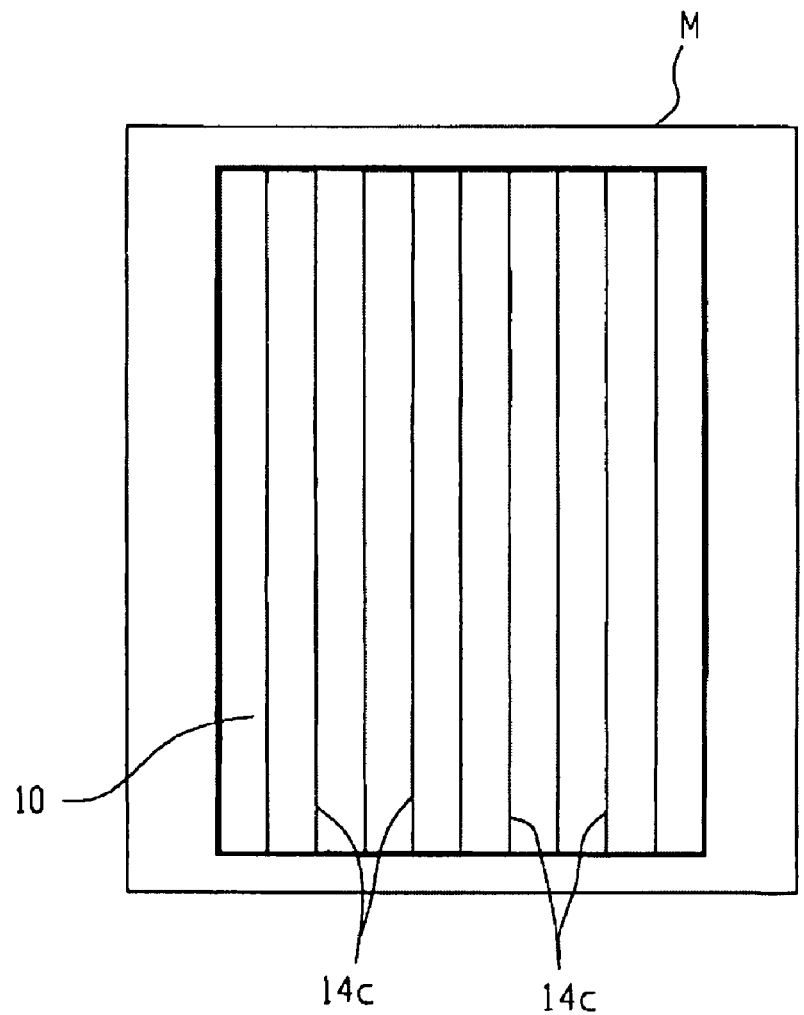
FIG. 8 is an illustration showing another configuration of a mask according to the first embodiment.

Although the mask according to the first embodiment has the foreign-substance protection film 10 supported by the supports 14a and 14b as shown in FIG. 3, supports 14c as shown in FIG. 8, provided straight along the X direction (scanning direction), alone may be provided. The mask shown in FIG. 8 has a smaller supporting strength of the foreign-substance protection film 10 than the mask M shown in FIG. 3. In such a case, however, the degree of illumination unevenness due to the supports may decrease because supports having a profile of the field stop slit S along Y direction are not provided to extend in Y direction. Accordingly, only the one dimensional, illumination unevenness due to the supports 14c has to be corrected, thereby more easily correcting the illumination unevenness.

Next, an exposure apparatus and a mask according to a second embodiment will be described below with reference to the drawings. The configuration of the exposure apparatus according to the second embodiment is similar to that of the first embodiment, and hence, the detailed description of the exposure apparatus according to the second embodiment will be omitted. In the description of the exposure apparatus according to the second embodiment, the same numerals as that of the first embodiment are applied to the same components.

Figure 9:
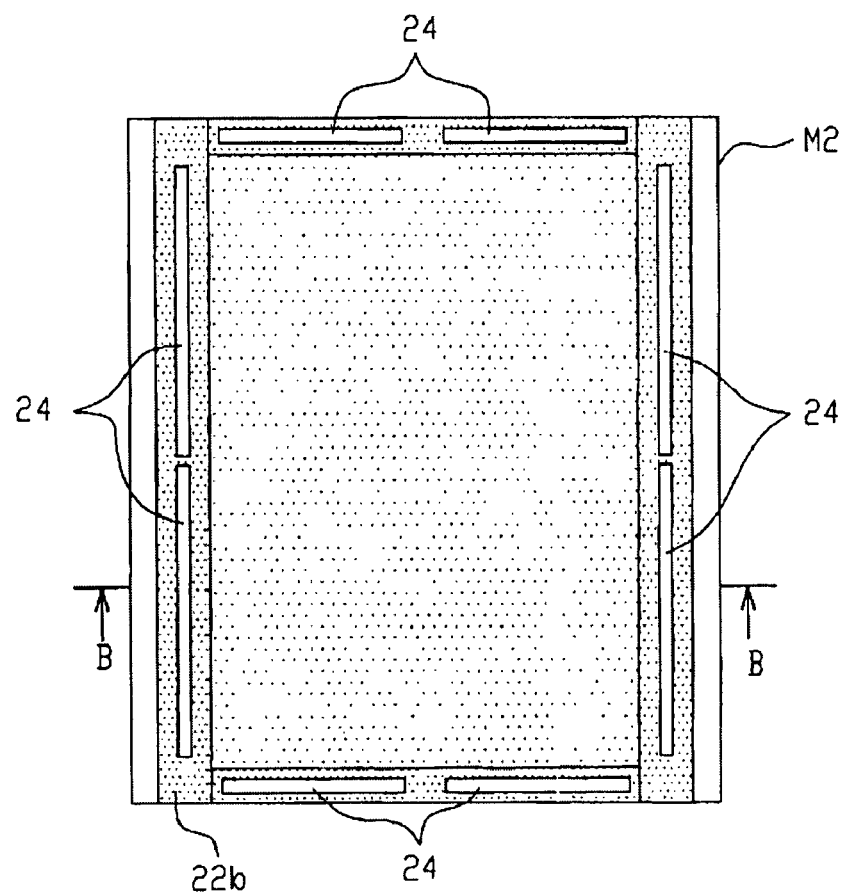
FIG. 9 is a plan view showing a configuration of a mask according to a second embodiment.
Figure 10:
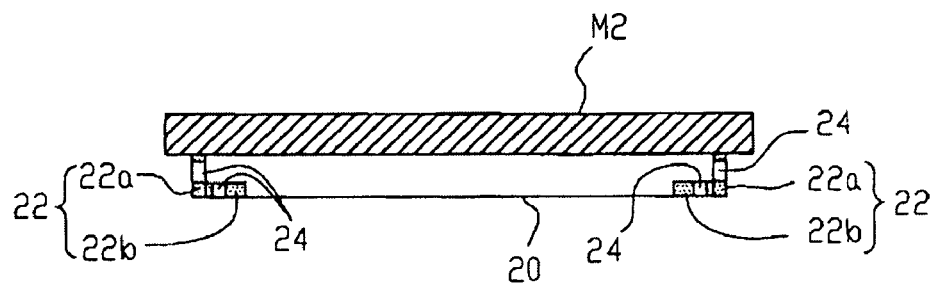
FIG. 10 is a cross-sectional view showing the configuration of the mask according to the second embodiment.

FIG. 9 is a plan view showing a configuration of a mask M2 according to the second embodiment. FIG. 10 is a cross-sectional view showing the configuration of the mask M2 taken along line B-B in FIG. 9. As shown in FIGS. 9 and 10, the mask M2 includes a foreign-substance protection film 20 spaced away from the surface of the mask M2. The protection film 20 may be, for example, 10 mm away from the mask M. The foreign-substance protection film 20 prevents a foreign substance from adhering to the surface of the mask M2.

Foreign-substance protection film frames 22 support the foreign-substance protection film 20. Each of the foreign-substance protection film frames 22 includes a standing portion 22a standing on the peripheral edge of the surface of the mask M2, and a supporting portion 22b protruding from the standing portion 22a along the surface having the pattern of the mask M2. The standing portion 22a and supporting portion 22b each have a plurality of filters 24. The filters 24 prevent foreign substances from entering into the pattern surface and allow air to circulate sufficiently.

The amount of air circulating through the filters is determined depending on the thickness and area of the filters. Also, the amount of foreign substance to be removed is determined depending on the thickness of the filters. To increase the amount of air circulating through the filters while holding the capability of the filters for removing the foreign substance, it is necessary to increase the area of the filter. Therefore, in this embodiment, as many filters 24 as possible are provided at the standing portion 22a and supporting portion 22b. Because the foreign-substance protection film 20 is transported between an air space and a vacuum space (described later), the filters 24 may reduce the difference between an air-pressure applied to an inner surface and the pressure applied to an outer surface of the foreign substance protection film 20, to avoid action of a stress due to the difference between the pressure applied to the inner surface and the pressure applied to the outer surface.

Before exposure, the mask M2 is carried-in to the mask stage 55 through a load-lock chamber by a mask-transporting device while being protected by the foreign-substance protection film 20. After exposure, the mask M2 is carried-out from the mask stage 55 through the load-lock chamber by the mask-transporting device. The load-lock chamber may be evacuated or released to air.

In particular, the mask M2 protected with the foreign-substance protection film 20 is carried-in to the load-lock chamber in an air atmosphere by the mask-transporting device, and the load-lock chamber is evacuated so as to carrying in the mask M2 to the exposure apparatus in a vacuum atmosphere. The mask M2 is shifted from an air atmosphere to a vacuum atmosphere (reduced-pressure atmosphere), at a rate of change, for example 100 Pa/sec, that allows the difference between the pressure applied to the inner surface and the pressure applied to the outer surface of the foreign-substance protection film 20 to be held at a predetermined value or smaller. The difference between the pressure applied to the inner surface and the pressure applied to the outer surface of the foreign-substance protection film 20 is varied depending on the break strength determined in accordance with the thickness, material, and the like of the foreign-substance protection film 20, or depending on the allowed applied stress determined in accordance with the area of the foreign-substance protection film 20. The rate of change may be determined by calculations or experiments in accordance with these parameters. In shifting to a vacuum environment from an air environment, when the load-lock chamber is evacuated at a predetermined rate, the difference between the pressure applied to the inner surface and the pressure applied to the outer surface is increased at the beginning, and the difference of the pressures is reduced halfway. This is because the variation in degree of vacuum in the chamber with respect to time is logarithmic. Therefore, it is preferable that the rate of evacuation is slow at the beginning and gradually increased.

The mask M2 provided with the foreign-substance protection film 20 is carried-in from the load-lock chamber, now at a vacuum atmosphere, to the mask stage 55 for exposure. After exposure, the mask M2 provided with the foreign-substance protection film 20 is carried-out from the exposure apparatus in a vacuum atmosphere and is transported to the load-lock chamber in a vacuum atmosphere. The load-lock chamber transitions to an air atmosphere, so that the mask M2 is handed over to the mask-transporting device in the air atmosphere. At this time, the mask M2 is shifted to the air atmosphere from the vacuum atmosphere (reduced-pressure atmosphere), at a rate of change, for example, 100 Pa/sec, that allows the difference between the pressure applied to the inner surface and the pressure applied to the outer surface of the foreign-substance protection film 20 to be held at a predetermined value or smaller.

The mask according to the second embodiment includes the foreign-substance protection film 20 that prevents a foreign substance from adhering to the pattern surface. In addition, the plurality of filters 24 are provided at the standing portions and supporting portions of the foreign-substance protection film 20. Accordingly, the difference between the pressure applied to the inner surface and the pressure applied to the outer surface of the foreign-substance protection film 20 may be controlled appropriately. Therefore, the foreign-substance protection film 20 is less likely to break because of stress due to the difference between the pressure applied to the inner surface and the pressure applied to the outer surface.

In addition, with the exposure apparatus according to the second embodiment, the mask M2 may be shifted to a vacuum atmosphere from an air atmosphere, or it may be shifted to the an air atmosphere from a vacuum atmosphere, at a rate of change that allows the difference between the pressure applied to the inner surface and the pressure applied to the outer surface of the foreign-substance protection film 20 to be held at the predetermined value or smaller. Accordingly, the foreign-substance protection film 20 is less likely to break because of the stress due to the difference between the pressure applied to the inner surface and the pressure applied to the outer surface of the foreign-substance protection film 20.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for protecting a projection lithography mask, the mask having a pattern for transfer to a substrate, the apparatus comprising:
   a film frame including a standing portion on a surface of the mask and a supporting portion protruding from the standing portion along the surface of the mask; and
   a film supported by the film frame at a position spaced away from the surface of the mask,
   wherein the standing portion and the supporting portion each have an integrated filter.

2. The apparatus according to claim 1, further comprising a film support for supporting the film.

3. The apparatus according to claim 2, wherein the film support is disposed within the film frame.

4. The apparatus according to claim 2, wherein the film support has a wire shape.

5. The apparatus according to claim 2, wherein the film support extends substantially straight along a direction the mask and the substrate are relatively scanned.

6. The apparatus according to claim 2, wherein the film support has a profile or an approximate profile of a fixed exposure area in a direction orthogonal to a scanning direction, the fixed exposure area being provided on the sensitive substrate in the direction orthogonal to the scanning direction.

7. A mask for transferring a pattern onto a sensitive substrate, the mask comprising:
   apparatus described in claim 1 attached to the mask for protecting the mask surface.

8. An exposure apparatus for transferring a pattern onto a sensitive substrate by using the mask according to claim 7, wherein an atmosphere around the mask transitions from an air atmosphere to a reduced-pressure atmosphere, or from a reduced-pressure atmosphere to an air atmosphere, at a speed that allows a difference between a pressure applied to one surface of the film and a pressure applied to the other surface of the film to be held at a predetermined value or smaller.

9. An exposure apparatus for transferring a pattern onto the substrate by using the mask according to claim 7 in a reduced-pressure atmosphere.

10. An apparatus for protecting a projection lithography mask for a scanning exposure apparatus, the mask having a pattern for transfer to a sensitive substrate, the apparatus comprising:
    a film spaced away from a surface of the mask;
    a film frame for supporting the film at peripheral region of the film; and
    a film support for supporting the film at an inner region of the film,
    wherein the film support has a profile of a fixed arcuate exposure area in a direction orthogonal to a scanning direction of the scanning exposure apparatus, the fixed arcuate exposure area being provided on the sensitive substrate in the direction orthogonal to the scanning direction of the scanning exposure apparatus.

11. The apparatus according to claim 10, wherein the film support extends substantially straight along a direction the mask and the sensitive substrate are relatively scanned.

12. A mask for transferring a pattern onto a sensitive substrate, the mask comprising:
    apparatus described in claim 10 attached to the mask for protecting the mask surface.

13. An exposure apparatus for transferring a pattern onto a sensitive substrate by using the mask according to claim 12, wherein an atmosphere around the mask transitions from an air atmosphere to a reduced-pressure atmosphere, or from a reduced-pressure atmosphere to an air atmosphere, at a speed that allows a difference between a pressure applied to one surface of the film and a pressure applied to the other surface of the film to be held at a predetermined value or smaller.

14. An exposure apparatus for relatively moving the substrate and the mask according to claim 12 in a scanning direction with respect to a projection optical system and transferring a pattern of the mask onto the substrate, the apparatus comprising:
    a radiation-intensity-unevenness corrector for correcting unevenness of radiation intensity of exposure radiation generated due to the film support.

15. The exposure apparatus according to claim 14, wherein the radiation-intensity-unevenness corrector includes an exposure-radiation-distribution corrector for correcting distribution of exposure radiation in the scanning direction generated due to the film support extending in the scanning direction.

16. The exposure apparatus according to claim 15, further comprising:
    a slit for determining a fixed arcuate exposure area provided on the substrate, wherein the exposure-radiation-distribution corrector corrects the distribution of the exposure radiation in the scanning direction by varying a profile of the slit.

17. The exposure apparatus according to claim 14, wherein the radiation-intensity-unevenness corrector includes an exposure-radiation-amount-error corrector for correcting an error of amount of exposure radiation generated due to the film support extending in a direction orthogonal to the scanning direction.

18. An exposure apparatus for transferring a pattern onto the substrate by using the mask according to claim 12 in a reduced-pressure atmosphere.

* * * * *